United States Patent
Kitajima

(10) Patent No.: US 10,043,749 B2
(45) Date of Patent: Aug. 7, 2018

(54) SEMICONDUCTOR DEVICE

(71) Applicant: SII Semiconductor Corporation, Chiba-shi, Chiba (JP)

(72) Inventor: Yuichiro Kitajima, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/437,822

(22) Filed: Feb. 21, 2017

(65) Prior Publication Data
US 2017/0250136 A1 Aug. 31, 2017

(30) Foreign Application Priority Data
Feb. 25, 2016 (JP) .................................. 2016-034493

(51) Int. Cl.
*H01L 23/525* (2006.01)
*H01L 23/528* (2006.01)

(52) U.S. Cl.
CPC ........ *H01L 23/5258* (2013.01); *H01L 23/528* (2013.01); *H01L 23/5256* (2013.01)

(58) Field of Classification Search
CPC ......... H01L 21/02436; H01L 21/02518; H01L 21/702; H01L 21/71; H01L 23/53204
See application file for complete search history.

(56) References Cited

U.S. PATENT DOCUMENTS

2004/0140501 A1\* 7/2004 Kim .................... H01L 23/5258 257/328

OTHER PUBLICATIONS

Abstract, Publication No. 09-036234, Publication date Feb. 7, 1997.
Abstract, Publication No. 09-199596, Publication date Jul. 31, 1997.

\* cited by examiner

*Primary Examiner* — Cheung Lee
(74) *Attorney, Agent, or Firm* — Adams & Wilks

(57) ABSTRACT

Provided is a semiconductor device in which a fuse element, which is cuttable by a laser, can be stably cut. The fuse element includes an upper fuse element, a lower fuse wiring line, and a fuse connecting contact such that, in cutting the fuse element by a laser, the lower fuse wiring line is protected by an inter-layer film, and only the upper fuse element is efficiently melted and evaporated. In addition, the contact for connecting the upper fuse element and the lower fuse wiring line to each other is formed at a center of a laser irradiation region, and hence the connection portion receives the energy of the laser most efficiently.

8 Claims, 4 Drawing Sheets

SEMICONDUCTOR DEVICE

BACKGROUND OF THE INVENTION

1. Field of the Invention

The present invention relates to a semiconductor device, and more particularly, to a semiconductor device having a fuse element which enables a change of a circuit configuration through cutting of the fuse element.

2. Description of the Related Art

In a manufacturing process for semiconductor devices, there has been a method of changing a circuit configuration by cutting, after a wafer manufacturing process is finished, a fuse element made of, for example, polysilicon or metal, with the use of a laser, for example. With this method, after the electrical characteristics of a semiconductor device are measured, the value of a resistance can be corrected to obtain desired characteristics. Accordingly, this method is an effective method particularly in completion of semiconductor devices whose analog characteristics are important. In the method using a laser, stably cut of a fuse element is required.

In Japanese Patent Application Laid-open No. 9-199596, there is proposed a method involving an increase in an area of a fuse element which is fused by a laser or a formation of a constricted fusing part to gain a power margin, thereby stably cutting the fuse element.

Further, in Japanese Patent Application Laid-open No. 9-36234, there is provided a method involving a connection of stacked fuse elements with a contact, and cutting of the contact portion by a laser such that cutting failure hardly occurs.

One of problems in cutting a fuse element by a laser is cutting failure. As illustrated in FIG. 4, when fuse elements 15 are cut by a laser, a film which forms the fuse element 15 is blown off and a fuse cut mark 16 is formed. At this time, there occurs, for example, a short-circuit due to a fuse remain 17 that is formed when the fuse element 15 is not completely melted and evaporated due to lack of energy, or a short-circuit due to a fuse readhesion 18 that is an adhesion of a fuse element once melted and evaporated to its surrounding, both resulting in cutting failure. Short-circuit due to the fuse readhesion 18 may occur between adjacent fuse elements 15, and the situation is schematically illustrated in FIG. 4.

Those types of cutting failure are more liable to occur when a thicker film is formed on the fuse element 15. For example, in a case of a multilayer wiring structure using a polysilicon layer located in a lower layer portion as fuse elements 15, films formed on the fuse elements 15 vary widely, and it is difficult to obtain a condition that enables more stable fuse cutting. This means that the thicknesses of the films remaining in an opening region 43 of the protective film vary. The opening region 43 of the protective film is formed above the fuse element 15, and corresponds to a region obtained by removing a final protective film, for example, a nitride film.

In Japanese Patent Application Laid-open No. 9-199596, which is an example of the related art, it is conceivable that there is a risk of a short-circuit when the fuse readhesion 18, illustrated in FIG. 4, occurs since the cut surfaces of the fuse elements 15 are exposed at the same layer.

In Japanese Patent Application Laid-open No. 9-36234, which is another example of the related art, the fuse elements are stacked and the fuse element located in the upper layer has the constricted part such that the risk of a short-circuit, which may occur in Japanese Patent Application Laid-open No. 9-199596, is reduced. In this structure, however, the fuse element located in the lower layer is irradiated with a laser to no small extent. When the fuse element located in the lower layer is concerned, there is a high risk that the fuse element does not completely evaporate or readheres to its surrounding since the film formed on the fuse element is thick, and the fuse element does not receive sufficient energy from the laser. As a result, short-circuit between the fuse element located in the upper layer and the fuse element located in the lower layer may occur due to the fuse readhesion 18.

SUMMARY OF THE INVENTION

The present invention has been made in view of the above-mentioned troubles, and has an object to provide a semiconductor device having a fuse element in which cutting failure due to a remaining fuse does not occur.

In order to achieve the above-mentioned object, according to one embodiment of the present invention, there is provided a semiconductor device having the following structure: fuse elements cuttable by a laser each include an upper fuse element and a lower fuse wiring line; the fuse elements are connected to each other with contacts formed at the centers of laser irradiation regions to be irradiated with a laser; and a silicon nitride film is formed, as an inter-layer film, between the upper fuse element and the lower fuse wiring line.

According to the present invention, in cutting the fuse element by a laser, the lower fuse wiring line is protected by the silicon nitride film, and only the laser irradiation region, which is a part of the upper fuse element, efficiently melts and evaporates. Further, the contact for connecting the upper fuse element and the lower fuse wiring line to each other is formed at the center of the laser irradiation region, and hence the laser irradiation region having the contact at its center receives energy most efficiently. As a result, there can be provided a fuse element in which insufficient melting and evaporation due to lack of energy hardly occurs, and short-circuit hardly occurs even when readhesion occurs.

DESCRIPTION OF THE EMBODIMENTS

Now, embodiments of the present invention are described with reference to the drawings.

Figure 1:
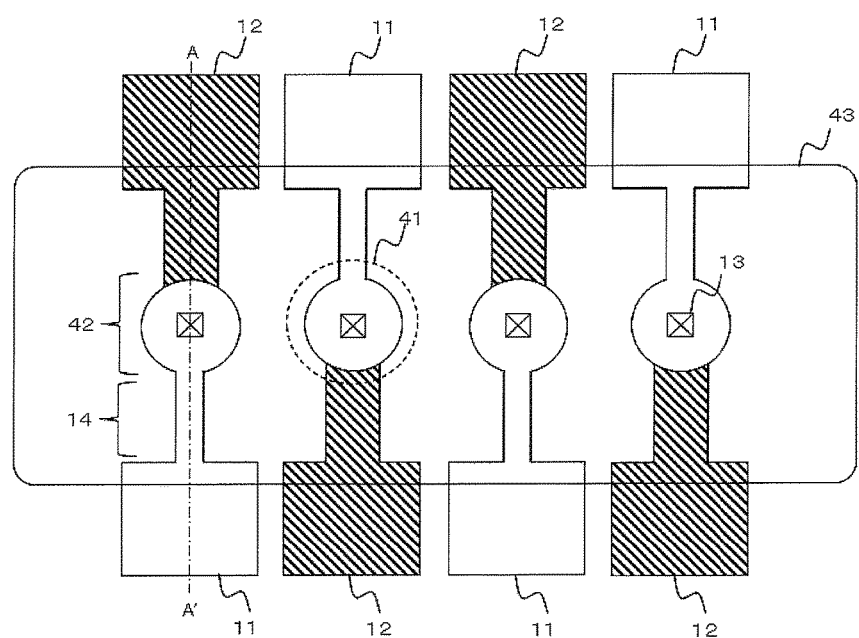
FIG. 1 is a plan view for illustrating a semiconductor device according to a first embodiment of the present invention.

FIG. 1 is a plan view of a semiconductor device according to a first embodiment of the present invention. An upper fuse element 11 and a lower fuse wiring line 12 are formed, and a fuse connecting contact 13 for connecting the upper fuse element 11 and the lower fuse wiring line 12 to each other is formed at the center of a laser irradiation region 42 of the upper fuse element 11. One fuse element is formed by the upper fuse element 11, the lower fuse wiring line 12, and the fuse connecting contact 13. The upper fuse element 11 has the laser irradiation region 42 to be irradiated with a laser and an upper fuse wiring portion 14 extending from the laser irradiation region 42. FIG. 1 is an illustration of a state in which a plurality of fuse elements are formed in parallel to each other, and an opening region of the protective film 43 is formed on the plurality of fuse elements. The opening region of the protective film 43 is a region in which a final protective film 26, for example, a silicon nitride film 23, formed in an upper part of the semiconductor device is removed.

The upper fuse elements 11 and the lower fuse wiring lines 12 forming adjacent fuse elements are alternately formed. That is, the upper fuse element 11 located at one end of the opening region of the protective film 43 is adjacent to the lower fuse wiring line 12. This configuration may greatly reduce a fear that pieces of the upper fuse element 11 blown off through laser radiation readhere to the surrounding of the radiated part, to thereby cause a short-circuit.

Figure 2:
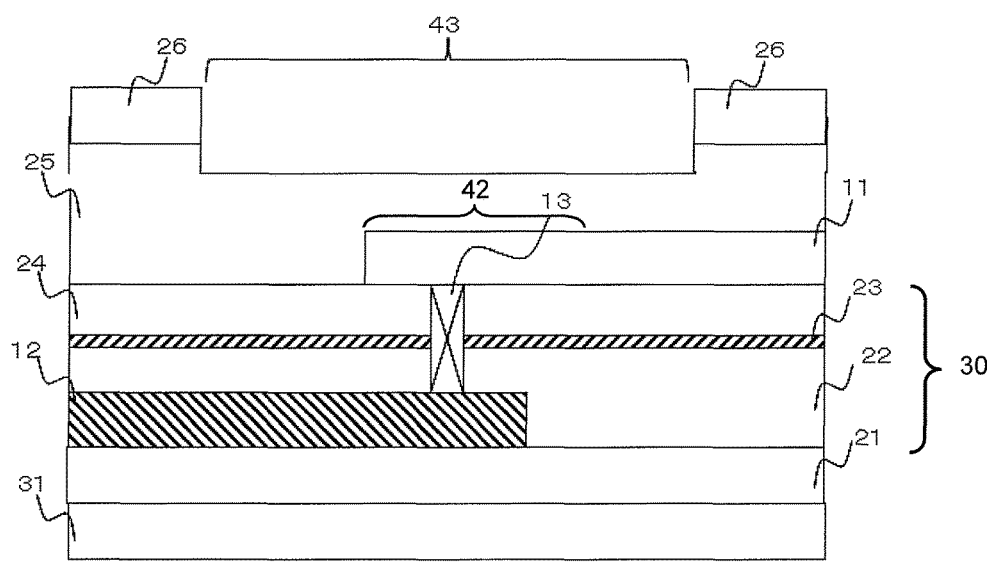
FIG. 2 is a sectional view for illustrating the semiconductor device according to the first embodiment of the present invention.

Next, description is given with reference to FIG. 2 that is a sectional view of the semiconductor device according to the first embodiment of the present invention. As illustrated in FIG. 2, a first inter-layer insulating film 21 is formed on a silicon substrate 31 serving as a semiconductor substrate. The lower fuse wiring line 12 is formed on the first inter-layer insulating film 21. An inter-fuse insulating film 30 is formed so as to cover the lower fuse wiring line 12 and the first inter-layer insulating film 21. Further, the upper fuse element 11 is formed on the inter-fuse insulating film 30, and a second inter-layer insulating film 25 and a final protective film 26 are formed on the upper fuse element 11. The inter-fuse insulating film 30 has the fuse connecting contact 13 for electrically connecting the upper fuse element 11 and the lower fuse wiring line 12 to each other. In the final protective film 26, the opening region of the protective film 43 is formed so as to open a region above a part of the upper fuse element 11, which includes the laser irradiation region 42.

In this embodiment, the inter-fuse insulating film 30 is a multilayer film including a third inter-layer insulating film 22 covering the lower fuse wiring line 12 and the first inter-layer insulating film 21, a silicon nitride film 23 formed on the third inter-layer insulating film 22, and a fourth inter-layer insulating film 24 covering the silicon nitride film 23. Here, when the silicon nitride film 23 is used, the silicon nitride film 23 should be at least wider than the region of a laser spot 41 of FIG. 1. Thus, although it is not necessary to form the silicon nitride film 23 between the laser spots 41 of the adjacent fuse elements, the silicon nitride film 23 may be formed over the entire opening region of the protective film 43.

The fuse connecting contact 13 is formed so as to connect the upper fuse element 11 and the lower fuse wiring line 12 to each other. Further, the fuse connecting contact 13 is formed at the center of the laser irradiation region 42. A part of the second inter-layer insulating film 25 that is located on the upper fuse element 11 and in the opening region of the protective film 43 should have a thickness that prevents exposure of the upper fuse element 11, in consideration of variation the thickness in manufacturing. On the other hand, since a power margin for stable cutting of the fuse element is reduced by the thickness of the part of the second inter-layer insulating film 25 located on the upper fuse element 11, the part of the second inter-layer insulating film 25 should be thin in consideration of the thickness that prevents exposure of the upper fuse element 11.

In cutting the fuse element by laser, the laser is radiated such that the fuse connecting contact 13 coincides with the center of the laser spot 41. The laser irradiation region 42 of the upper fuse element 11 absorbs the energy of the laser to generate heat when the fuse element is irradiated with the laser, thereby melting and evaporation take place. At that time, the volume of the laser radiated part expands resulting in blow off of the part of the second inter-layer insulating film 25 located on the upper fuse element 11 by the stress of the volume expansion, and the evaporated laser irradiation region 42 diffuses outward, which completes the cutting.

The silicon nitride film 23 has a role of preventing the energy of a laser from transferring to the lower fuse wiring line 12 and a role of protecting the lower fuse wiring line 12. By virtue of the presence of the silicon nitride film 23, the lower fuse wiring line 12 does not receive the energy of a laser. Thus, the lower fuse wiring line 12 does not suffer from insufficient melting and evaporation, and from adhesion caused by insufficient energy reception of the laser, which leads to cutting failure, and only the upper fuse element 11 efficiently receives the energy of a laser.

Further, a laser is radiated such that the fuse connecting contact 13 coincides with the center of the laser spot 41, and hence the energy density of the laser is the highest at a part of the laser irradiation region 42 located on the fuse connecting contact 13. This is because the energy density of a laser is reduced from the center of the laser to the outer periphery thereof. From this point, the part of the laser irradiation region 42 located on the fuse connecting contact 13 melts and evaporates most easily, and hence cutting failure hardly occurs. Further, readhesion of the laser irradiation region 42, which is a part of the upper fuse element 11, around the surrounding of the radiated part due to insufficient melting and evaporation generally occurs in the vicinity of the laser spot 41 in which the energy density of the laser is low. In the structure of the present invention, since the fuse connecting contact 13 for connecting the upper fuse element 11 and the lower fuse wiring line 12 to each other is formed at the center of the laser spot, a short-circuit due to readhesion hardly occurs.

Further, readhesion is liable to occur on the side of the upper fuse wiring portion 14, which is illustrated in FIG. 1. This is because the energy of a laser transferred to the upper fuse wiring portion 14 is not sufficient enough to melt and evaporate by itself. Thus, when readhesion to the upper fuse wiring portion 14 occurs, there is a risk of short-circuit to the adjacent fuse elements. However, when the upper fuse wiring portions 14 are alternately formed as described in the present embodiment, it is possible to avoid short-circuit between the adjacent fuse elements.

Further, it is desired that the laser irradiation region 42, which is the part of the upper fuse element 11 and surrounds the fuse connecting contact 13, have a circular shape. This is because the circular shape enables the most uniform reception of the energy of a laser, and prevention of collapse in a side wall direction, which may occur when the second inter-layer insulating film 25 is blown off. The laser irradiation region 42 may have a rectangular shape or a polygonal shape. The shape of a part of the lower fuse wiring line 12 connected to the fuse connecting contact 13 is not particularly specified, and may be determined in the same manner as an ordinary wiring line.

Figure 3:
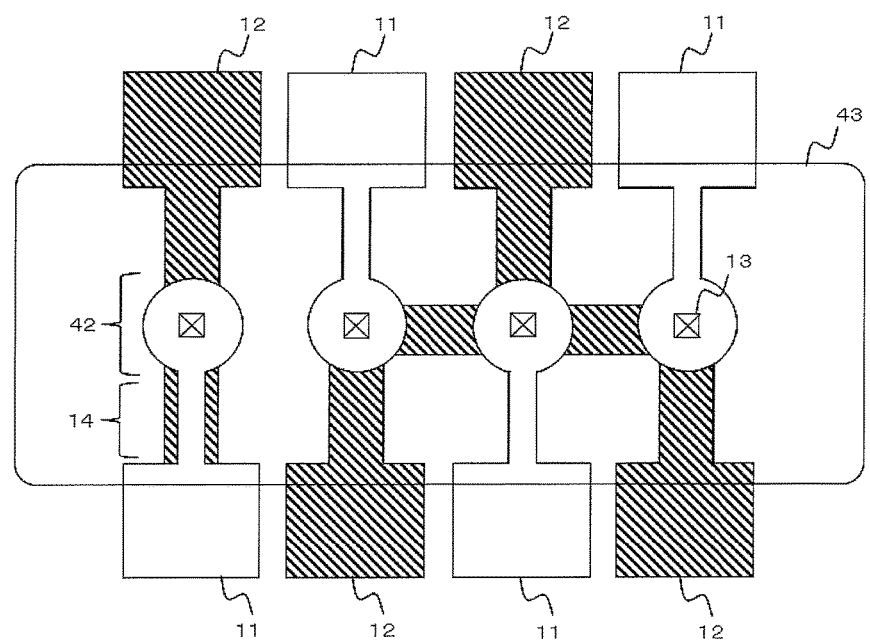
FIG. 3 is a plan view for illustrating a semiconductor device according to a second embodiment of the present invention.
Figure 4:
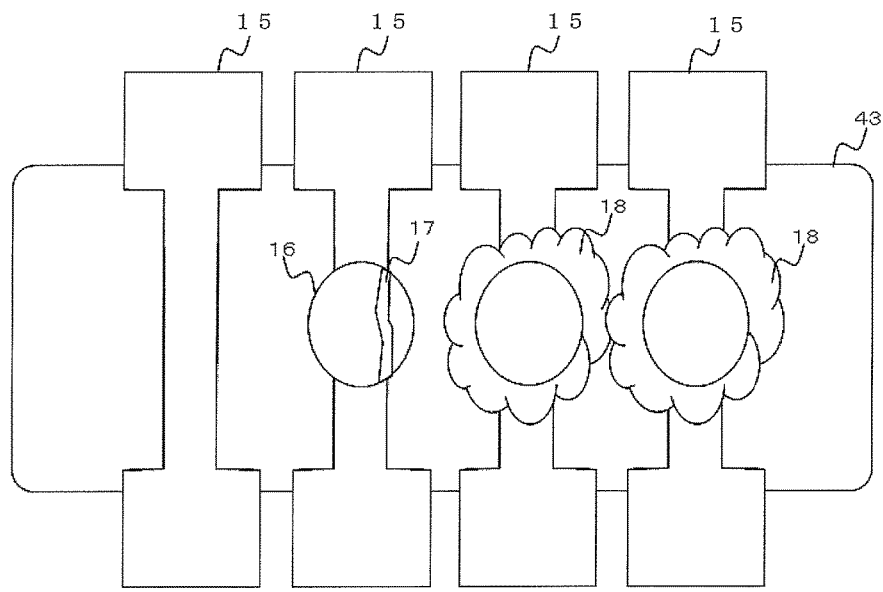
FIG. 4 is a plan view for illustrating an example of a related-art semiconductor device.

FIG. 3 is a plan view for illustrating a semiconductor device according to a second embodiment of the present invention. In the second embodiment, the degree of freedom of the layout of the lower fuse wiring line 12 is described.

The lower fuse wiring line 12 is protected by the silicon nitride film 23, and hence the lower fuse wiring line 12 can be freely arranged as illustrated in FIG. 3, which means that the layout design of the lower fuse wiring line 12 becomes easy. The lower fuse wiring line 12 may be formed from one side of the opening region of the protective film 43 to the other side thereof while being bent downward. The lower fuse wiring lines 12 may be connected to each other, or the lower fuse wiring line 12 may be branched into a plurality of lower fuse wiring lines 12.

Further, the upper fuse wiring portion of the upper fuse element 11, which is the wiring line extending from the laser irradiation region 42, has a smaller width and is narrower than the wiring line of the lower fuse wiring line 12, which extends from the fuse connecting contact 13. This is because, with this, the wiring line of the upper fuse element 11, which extends from the fuse connecting contact 13, is easily cut through laser radiation.

In the present invention, since the upper fuse element 11, the lower fuse wiring line 12, and the fuse connecting contact 13 forma fuse element, the upper fuse element 11 may be a metal wiring line, and the lower fuse wiring line 12 may be made of polysilicon. Further, both of the upper fuse element 11 and the lower fuse wiring line 12 may be metal wiring lines. The fuse connecting contact 13 may be made of the same material as the upper fuse element 11, or may have a tungsten plug structure using a high-melting-point metal material. A fuse element can be formed between other wiring lines as long as the silicon nitride film 23 is formed, as the inter-fuse insulating film, between the upper fuse element 11 and the lower fuse wiring line 12, and the upper fuse element 11 and the lower fuse wiring line 12 can be connected to each other with the fuse connecting contact 13.

As described above, with the use of the present invention, in cutting a fuse element by a laser, the lower fuse wiring line 12 is protected by the silicon nitride film 23, and only the upper fuse element 11 is efficiently melted and evaporated. Further, the fuse connecting contact 13 for connecting the upper fuse element 11 and the lower fuse wiring line 12 to each other is formed at the center of the laser irradiation region 42, and the laser irradiation region 42, which has the connection portion at its center, receives the energy of the laser most efficiently. As a result, there can be provided a fuse element in which insufficient melting and evaporation due to lack of absorbed energy hardly occurs, and a short circuit hardly occurs even when readhesion occurs.

What is claimed is:

1. A semiconductor device, comprising:
   a semiconductor substrate;
   a first inter-layer insulating film formed on a surface of the semiconductor substrate;
   a lower fuse wiring line formed on the first inter-layer insulating film;
   an inter-fuse insulating film formed on the lower fuse wiring line;
   an upper fuse element, which is formed on the inter-fuse insulating film, and has a laser irradiation region and an upper fuse wiring portion;
   a fuse connecting contact formed in the inter-fuse insulating film, for connecting the lower fuse wiring line and the upper fuse element to each other; and
   a second inter-layer insulating film formed on the inter-fuse insulating film,
   the laser irradiation region having a circular shape,
   the fuse connecting contact being formed at a center of the laser irradiation region.

2. A semiconductor device according to claim 1, wherein the second inter-layer insulating film comprises a third oxide film, a silicon nitride film, and a fourth oxide film.

3. A semiconductor device according to claim 1, wherein the upper fuse wiring portion of the upper fuse element is prevented from being adjacent to an upper fuse wiring portion of an upper fuse element adjacent to the upper fuse element.

4. A semiconductor device according to claim 1, wherein the laser irradiation region has a circular shape in plan view.

5. A semiconductor device according to claim 1, further comprising:
   a final protective film formed on the second inter-layer insulating film; and
   an opening region of the final protective film, which is formed in the final protective film and in a region above the upper fuse element, a part including the laser irradiation region,
   wherein the lower fuse wiring line is formed from one side of the opening region of the protective film to another side of the opening region of the protective film while being bent downward.

6. A semiconductor device according to claim 1, wherein the lower fuse wiring line and the upper fuse element are made of different materials.

7. A semiconductor device according to claim 1, wherein the upper fuse element and the fuse connecting contact are made of different materials.

8. A semiconductor device according to claim 1, wherein the upper fuse wiring portion has a smaller width than the lower fuse wiring line.

* * * * *